United States Patent
Kasha et al.

(10) Patent No.: US 8,463,215 B2
(45) Date of Patent: *Jun. 11, 2013

(54) INTEGRATING COMPONENTS IN A RADIO TUNER INTEGRATED CIRCUIT (IC) FOR A TRACKING FILTER

(75) Inventors: Dan B. Kasha, Seattle, WA (US); Jing Li, Austin, TX (US); Russell Croman, Austin, TX (US); Michael Johnson, Austin, TX (US); Scott D. Willingham, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 692 days.

This patent is subject to a terminal disclaimer.

(21) Appl. No.: 12/649,011

(22) Filed: Dec. 29, 2009

(65) Prior Publication Data

US 2011/0159829 A1   Jun. 30, 2011

(51) Int. Cl.
H04B 1/18 (2006.01)
(52) U.S. Cl.
USPC .................. 455/150.1; 455/333; 455/334
(58) Field of Classification Search
USPC ............. 455/150.1, 188.1, 191.1, 191.2, 323, 455/333, 334
See application file for complete search history.

(56) References Cited

U.S. PATENT DOCUMENTS

| | | |
|---|---|---|
| 4,107,621 A | 8/1978 | Furutani et al. |
| 5,270,667 A | 12/1993 | Upton |
| 6,075,414 A | 6/2000 | Nagaoka et al. |
| 6,147,568 A | 11/2000 | Souetinov |
| 6,181,206 B1 | 1/2001 | Palmisano et al. |
| 6,323,735 B1 | 11/2001 | Welland et al. |
| 6,356,745 B1 | 3/2002 | Lee et al. |
| 6,400,204 B1 | 6/2002 | Davis |
| 6,483,390 B2 | 11/2002 | Welland |
| 6,553,216 B1 | 4/2003 | Pugel et al. |
| 6,658,244 B2 * | 12/2003 | Schmal et al. ................ 455/296 |
| 6,683,511 B2 | 1/2004 | Souetinov et al. |
| 6,724,827 B1 | 4/2004 | Patsiokas et al. |
| 6,735,418 B1 | 5/2004 | MacNally et al. |
| 6,771,475 B2 | 8/2004 | Leete |
| 7,127,217 B2 | 10/2006 | Tuttle |
| 7,202,749 B2 | 4/2007 | Mohammadi |
| 7,209,727 B2 | 4/2007 | Castaneda et al. |
| 7,272,375 B2 | 9/2007 | Tuttle et al. |
| 7,355,476 B2 | 4/2008 | Kasha et al. |
| 7,386,284 B2 | 6/2008 | Thompson |

(Continued)

OTHER PUBLICATIONS

*Silicon Laboratories Inc.* (Plaintiff), vs. *Quintic Corporation and Quintic Microelectronics Co., Ltd.* (Defendants), Civil Action No. A10CA066 SS, Complaint for Patent Infringement filed on Jan. 25, 2010, in the United States District Court Western Division of Texas Austin Division.

(Continued)

*Primary Examiner* — Nhan Le
(74) *Attorney, Agent, or Firm* — Trop, Pruner & Hu, P.C.

(57) ABSTRACT

In one embodiment, the present invention includes a method for configuring a single chip radio tuner having a configurable front end, which may be adapted within an integrated circuit (IC). The method may include setting a controller of the tuner with configuration information for a radio in which the tuner is located. Then, control signals responsive to the configuration information can be sent to the configurable front end to configure the tuner.

20 Claims, 12 Drawing Sheets

U.S. PATENT DOCUMENTS

| | | |
|---|---|---|
| 7,426,376 B2 | 9/2008 | Srinivasan |
| 7,512,386 B2 | 3/2009 | Kalajo et al. |
| 7,660,566 B2 | 2/2010 | Kuo et al. |
| 7,667,542 B2 | 2/2010 | Kasha et al. |
| 7,697,901 B2 * | 4/2010 | Sridharan et al. ............... 455/86 |
| 8,149,955 B2 * | 4/2012 | Tired ........................... 375/318 |
| 8,180,312 B2 * | 5/2012 | Brobston et al. .............. 455/324 |
| 8,254,862 B2 * | 8/2012 | Kasha et al. ............... 455/150.1 |
| 2003/0001690 A1 | 1/2003 | Kuroda et al. |
| 2003/0117206 A1 | 6/2003 | Ohnakado |
| 2005/0134385 A1 | 6/2005 | Costa et al. |
| 2007/0052482 A1 | 3/2007 | Kasha et al. |
| 2007/0058308 A1 | 3/2007 | Thijs et al. |

OTHER PUBLICATIONS

U.S. Appl. No. 12/649,006, filed on Dec. 29, 2009, entitled "Configurable Radio Front End," by Dan B. Kasha, et al.
U.S. Patent and Trademark Office, Office Action mailed Dec. 8, 2011 in U.S. Appl. No. 12/649,006.

* cited by examiner

INTEGRATING COMPONENTS IN A RADIO TUNER INTEGRATED CIRCUIT (IC) FOR A TRACKING FILTER

BACKGROUND

Radios are pervasive, and can take many different forms. For example, radios can be used to receive signals of different bands, e.g., AM, FM, weather band and so forth. Also, radios can be used in many different systems. The systems range from relatively simple and basic low-cost radios such as transistor radios, clock radios, and portable radios, to more sophisticated systems, for example, home entertainment systems, automobile entertainment systems, cellular telephones, advanced portable media devices and so forth.

Historically, radios were formed using many discrete analog components. However, in recent years, more components of a radio have been incorporated into semiconductor devices, reducing a bill of materials for the radio. One problem with such semiconductor devices however is that they are typically fixed on manufacture such that it is difficult to provide for flexibility for incorporation of the given semiconductor device into many different system types. Accordingly, some manufacturers will fabricate many different semiconductor products, each directed to a particular radio market. However, this leads to inefficiencies in design, manufacture, marketing and so forth. Accordingly, known radios, either formed by way of analog components or semiconductor-based, lack flexibility, which can lead to stringent design requirements for incorporation of the radio into a system.

SUMMARY OF THE INVENTION

According to one aspect, the present invention is directed to a single chip radio tuner, which may be adapted within an integrated circuit (IC). The tuner may be provided with a configurable front end to receive and process a radio frequency (RF) signal via a signal path. This configurable front end may be differently controlled depending on a particular radio implementation in which the tuner is adapted. In this aspect, the radio tuner can include a low noise amplifier (LNA) having an input coupled to a first pin of the IC and an output coupled to a second pin of the IC. Depending on the radio implementation, this LNA can be controlled to be part of the signal path or not part of the signal path. The front end may further include a mixer having an input coupled to a third pin of the IC, a variable impedance coupled to another pin of the IC, and a varactor coupled to yet another pin of the IC. All of these components can be controlled to act within the tuner as desired by a particular radio implementation.

According to another aspect, the present invention includes a method for calibrating an on-chip varactor that can be used to provide a selected level of capacitance to various components such as an off-chip tracking filter. In one embodiment, the method may include coupling a test tone signal from a test tone generator of the tuner IC to a controllable attenuator of the IC that in turn is coupled to the tracking filter. Then an output of the tracking filter is received in the tuner IC and a level of the tracking filter output can be determined via a peak detector of the tuner IC. A first value can be calculated based on first and second codes for controlling a capacitance of the varactor, where the first and second codes control the varactor when the peak detector trips and does not trip. Then a controlled value can be calculated based on third and fourth codes for controlling the capacitance, where the third and fourth codes control the varactor when the peak detector trips and does not trip and where the third code is less than the first value. This controlled value, which corresponds to a setting for the varactor at a given frequency, may then be stored, e.g., in a non-volatile storage. Such method may be performed at multiple frequencies to generate and store multiple controlled values, each corresponding to a frequency range within a radio band.

Yet another aspect of the present invention is directed to a radio that includes both on-chip and off-chip components. The on-chip components may be realized as a radio tuner adapted in an IC and which has a configurable front end to receive and process a RF signal via a signal path. Such front end may include, for example, a variable impedance to provide a selected impedance level to a matching network coupled to the radio tuner, a varactor to provide a selected capacitance level to a tracking filter coupled to the radio tuner, and a controller to control the variable impedance and the varactor responsive to a desired radio channel and a signal level of the RF signal. In turn, the tracking filter can be coupled to receive the RF signal and to output a filtered RF signal to the radio tuner, while using the on-chip varactor and an off-chip inductance as a tank for the filter.

A still further implementation is directed to a method for configuring such a tuner. The method may set a controller of the tuner (e.g., one or more control registers of the controller) with configuration information for a radio in which the tuner is located. Then, control signals responsive to the configuration information can be sent to the configurable front end to configure the tuner. For example, one control signal may be used to cause the LNA to be part of (or not part of) the signal path and another control signal used to configure the mixer for single-ended or differential operation. Still further signals may be used to control other front end components. For example, a varactor can be controlled to provide a selected amount of capacitance to a tracking filter. Further, based on a signal level of an RF signal a variable impedance can be controlled to provide a selected amount of impedance along the signal path.

DETAILED DESCRIPTION

Figure 1:
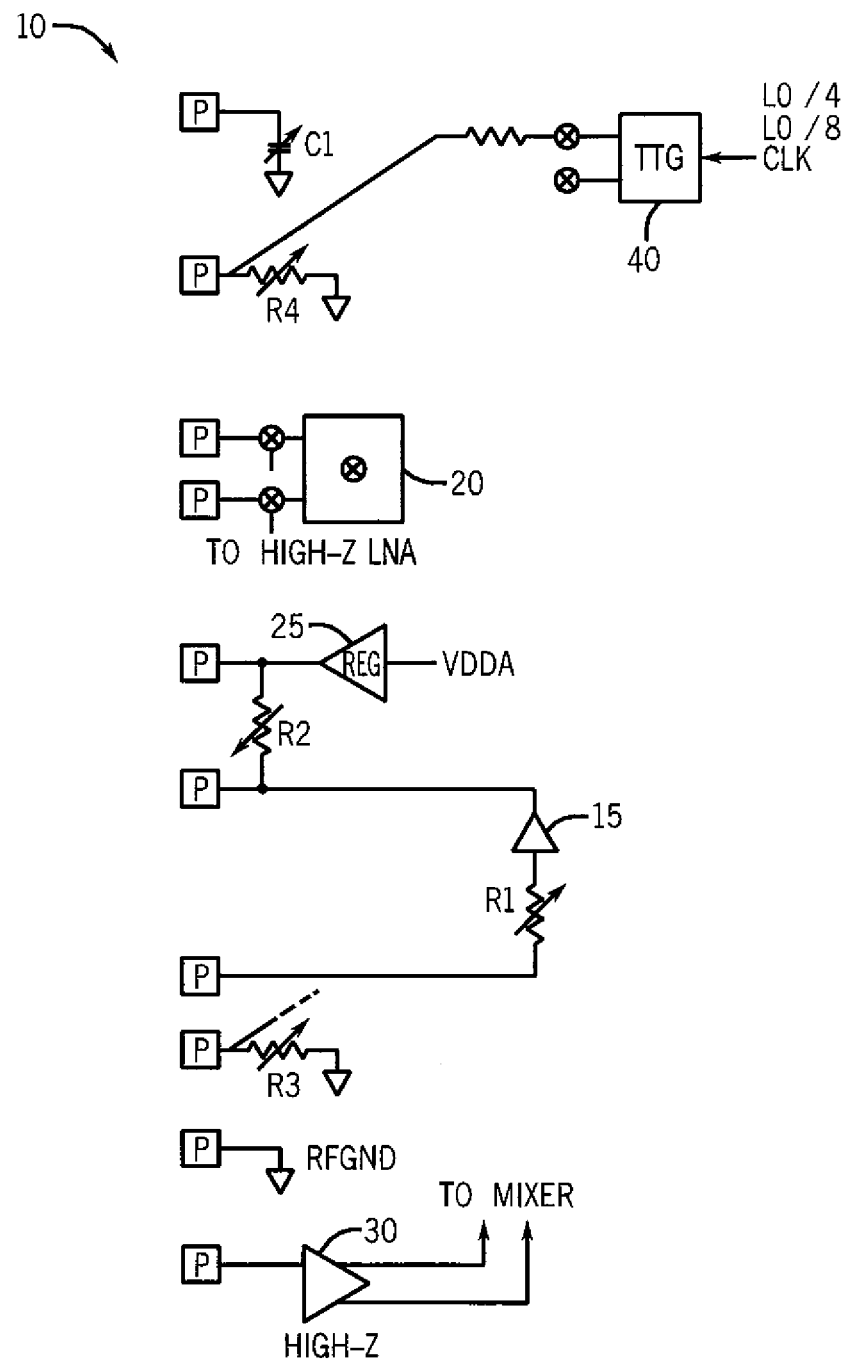
FIG. 1 is a schematic diagram of a portion of a front end of a radio tuner in accordance with one embodiment of the present invention.

Embodiments may provide configurability for a radio tuner to enable different signal paths for different radio designs using a single configurable integrated circuit (IC) radio tuner. As one example, a signal path may directly couple a radio frequency (RF) signal from an antenna directly to a mixer for downconversion without an interposed low noise amplifier (LNA). In other implementations, an on-chip LNA can be configured to operate in a loop-through mode in which its output is sent back off-chip to further components of a signal path.

For example, when high linearity is desired, the signal path may go straight into the mixer. If sensitivity is a concern, then an LNA may be interposed. In other implementations, a tracking filter may be desired to be included in the signal path to pre-select the band. In one embodiment, the tracking filter may include a variable capacitor and a variable resistance, which can be used as an attenuator so that strong signals that would overload analog circuits of an analog front end of the tuner can be clamped down.

However, such tracking filter can affect antenna operation, particularly in environments where there may be multiple (e.g., companion) tuners. For example, assume that a first tuner is tuning a channel at 88.5 MHz and thus a tracking filter is tuned to 88.5 MHz. However, the tracking filter can affect the signal provided to a companion tuner that is running, e.g., performing a band scan for automatic frequency jumping, and may be at a different frequency (e.g., 108 MHz). In one such implementation, the LNA can be used in the loop-through mode, essentially as a buffer such that the LNA output is coupled to the tracking filter. In a companion tuner mode with the LNA configured in loop-through mode, the LNA basically acts as a splitter to isolate the tracking filter from the LNA. The LNA (and a companion LNA of the second tuner) buffer the signal so that tracking filters after the LNA do not interact. Further, the combination of the two LNAs provides proper impedance, for example, 50 ohms.

Different implementations may also provide for differential or single-ended operation such that the LNA provides termination for the antenna, e.g., 50 ohms or other impedance. Thus in different embodiments, an antenna may be coupled directly into a LNA, the output of which is provided to a mixer input. Or in an embodiment without an LNA, the incoming RF signal can be provided to a tracking filter coupled before the mixer. In other implementations, e.g., for a low cost application, input of an RF signal into the mixer without a LNA or tracking filter may be possible. As one such example, the mixer may be controlled to be in a single-ended operation mode, and the RF signal coupled to it. A second example may be to provide a simple circuit to produce a differential signal for input to the mixer without the need of a balun. For example, an LC combination provides a phase shift of one path compared to the other, giving a differential signal at a given frequency or frequency range. When using such a circuit, the mixer can be configured for differential operation. This would possibly give slightly better performance with a few more inexpensive components. Yet another example is to provide the RF signal into a balun to create a better differential signal that is input into the mixer. A broadband matching network can be used in front of any of these implementations as well if desired.

Referring now to FIG. 1, shown is a simplified schematic diagram of a portion of a front end of a radio tuner in accordance with one embodiment of the present invention. As shown in FIG. 1, tuner 10 may be a single-die IC that includes both analog and digital circuitry and as such may be a mixed-signal chip. In various implementations, the IC may be fabricated using complementary metal oxide semiconductor (CMOS) process technologies. In various embodiments, this radio tuner can be configurable to be used in a wide variety of systems, ranging from relatively low-cost radio solutions to high-end radios. Furthermore, it is to be understood that the various systems in which the tuner can be incorporated may be conventional radios or radio functionality provided in another device such as a computer system, e.g., a desktop, mobile notebook, laptop, smart phone, portable digital assistant (PDA), or other such portable device. Other implementations may be configured for use in automobile entertainment systems, home entertainment systems, and so forth.

As seen in FIG. 1, tuner 10 may include various front end components that can be coupled to pins of the IC. Note that the term "pins" is intended to mean a connector between an on-chip component and an off-chip component and may be by way of pin, pad, surface mount, conductive bump or any other conductive communication between on-chip and off-chip domains. While shown as direct connections to such pins, understand that in certain implementations one or more of the components of the front end may be coupled to the corresponding pin or pins by way of bond wires, conductive traces or in another such manner. The different functionality and configurations of the different components that will now be described have been discussed in brief above, and will be discussed in further detail below.

To enable a wide range of configurability, the front end of tuner 10 may include components such as a LNA 15. In one embodiment, the LNA may be realized with a plurality of metal oxide semiconductor field effect transistors (MOSFETs), e.g., n-channel MOSFETs. Control signals from a controller, e.g., a microcontroller unit (MCU) of the tuner, may be coupled to gates of the MOSFETs to switch them on or off (i.e., in or out of a signal path). As seen, LNA 15 may be coupled between a pair of pins (all pins are generally shown in FIG. 1 with the reference designation P). An input termination impedance may be coupled to the LNA (the termination is a function of the circuit topology, transistor characteristics and their interaction with a resistor R1). In various embodiments, the impedance may be selectively controlled to provide a desired level of input termination (e.g., via control signals from the MCU). An internal load, represented by a variable impedance R2, may be coupled to the LNA output. This variable impedance may act as an internal load that may be adjustable to provide for different gains. In addition, the front end may include a voltage regulator 25 that provides a regulated voltage off-chip and can further be coupled to the output of LNA 15. One reason the regulated voltage is brought out is to have an external filter capacitor (not shown in FIG. 1) in order to reduce regulator noise that could affect the sensitivity. It also enables use of an external load instead of R2, based on desired performance characteristics. Via regulator 25, the LNA output is referenced to a supply voltage. Further, some embodiments may include an external load resistor to reduce bond wire coupling issues with respect to the LNA input and output pins. This external resistance can be in addition to or instead of the internal load resistor (i.e., R2 of FIG. 1). Such an external resistance can aid in adjusting gain for loop-through mode, as can the internal resistor.

Also provided in the front end may be a mixer 20 which in one embodiment may be a mixer formed using n-channel MOSFETs. Mixer 20 may have differential inputs which may be received from off-chip components via a pair of pins.

Mixer 20 can be switched into a single-ended mode where performance is optimized for that mode, or just used single-ended with some degradation. As will be described further below, for some implementations another on-chip LNA 30, which may be a high impedance (high-Z) LNA may also be present and may have its output coupled to the inputs of mixer 20 via on-chip connections, e.g., through a multiplexer (not shown in FIG. 1).

An off-chip matching network may be provided in some implementations. In one embodiment, this network may be used for weather band signals, which require good sensitivity. A matching network may include an inductor and a capacitor to provide a boost and resonate at a predetermined frequency (e.g., 160 MHz). Such network could be coupled to various locations in different configurations, e.g., the high-Z LNA (LNA 30), main LNA (LNA 15), the mixer, or some combination (e.g., mixer and high-Z LNA, or LNA 15 and mixer). The networks serve different functions. They can do broadband matching for the LNAs, and can do the same for the mixer, or can form a tracking filter for the mixer. Keep in mind that there are other configurations too, like a broadband match to LNA 15, and then a tracking filter coupled between the output of LNA 15 and the mixer inputs.

To enable various filtering and attenuation operations using on-chip components, variable impedances R3 and R4 may be coupled between corresponding pins (or nodes in external networks) and a reference voltage (e.g., a ground voltage) (in this case, the ground is the rfgnd pin shown in FIG. 1, as each resistor can be internally connected to this pin). However, each resistor can have its own second connection pin, or they could share a ground pin in some combination. The impedances can be digitally controlled, e.g., via control signals from the MCU, and in one embodiment may be implemented as MOSFETs. Or MOSFETs can be used to switch in resistance such that the resistance switched in is a combination of the switch resistance and the resistor being switched. In one example, the resistance may be about 80% on-chip resistance and 20% resistance of the MOSFETs, an example of which is described below.

As one example, variable impedance R3 may be used as an attenuator to prevent splatter. Such splatter can occur when there are multiple large blocking signals, creating resulting numerous intermodulation components that can interfere with the reception of smaller channels in the same band. In one embodiment, an approximately 20 millivolt signal, e.g., at the mixer input or the LNA input may be a typical set point such that incoming signals larger than this value can be attenuated to this value. While shown in FIG. 1 with two impedances which may be useful for certain applications, e.g. automotive applications where a received signal may be at a higher level, some implementations may only provide a single attenuator. Still further, a varactor C1 may be provided in the front end to enable application of a variable capacitance, which can be used for filtering and tuning operations as described below. In one embodiment, the on-chip varactor (also coupled to the rfgnd pin) can be implemented as a parallel network of capacitors that can be digitally controlled.

As further seen, a test tone generator 40 may be present that can be switchably coupled to one or more of the attenuators, e.g., R3 and R4, as will be discussed further below. In one embodiment, test tone generator 40 may generate a test tone at a predetermined frequency based on a received clock signal, e.g., a divided version of a local oscillator (LO) signal. While shown with these particular components in the embodiment of FIG. 1, understand that a front end may include additional, different, or fewer components, and a different coupling of these devices may be used in a particular system design, certain examples of which will be discussed further below. Also understand that other pins may be present and coupled to receive signals from off-chip and to send signals off-chip.

Many different system types may use a configurable front end such as shown in FIG. 1 to realize desired functionality. For example, representative usage cases may include: high performance tuner with a tracking filter; low bill-of-material (BOM) tuner without a tracking filter as may be used for low cost radios; high performance tuner with tracking filter and companion tuner; and low-BOM tuner with a companion tuner without tracking filter. Of course other usage cases are possible.

Figure 2:
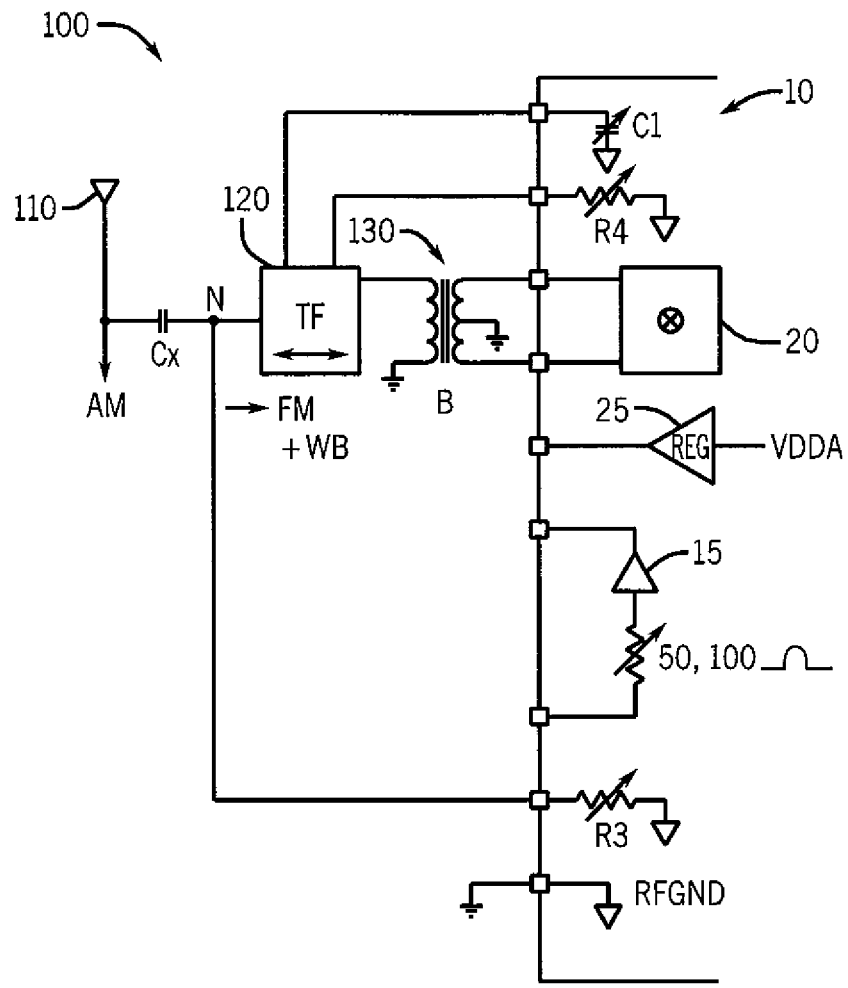
FIG. 2 is a schematic diagram of a radio system in accordance with one embodiment of the present invention.

Referring now to FIG. 2, shown is a schematic diagram of a radio system 100 in accordance with one embodiment of the present invention. As shown in FIG. 2, system 100 may be a system that is configured to use a tracking filter with a direct connection from an antenna to the tracking filter, such that use of the on-chip LNA is avoided. As one example, system 100 may be a high performance radio having high performance, without noise and sensitivity issues associated with the LNA. As used herein, a direct connection between two components means that there are no active devices between the first and second components. However, it is possible that various passive components, e.g., matching network, attenuators, capacitors or so forth may be coupled to a signal path directly connected between a first component and a second component. In such instances, it is understood that a direct connection is still present between the first and second components. Furthermore, understand that as shown in FIG. 2, all the components on the right hand side (i.e., to the right of the pins) may be present in an IC incorporating tuner 10, while the remaining components may be off-chip. For example, the components may be configured on a motherboard or other circuit board or substrate to provide support for the various components and routing of signals, e.g., by way of conductive traces on the board. Other components of course may be external to such board. For example, an antenna may typically be off the board and connected to the board by way of an appropriate connection.

As seen in FIG. 2, an antenna 110 is coupled to provide an incoming RF signal through an input capacitor $C_x$ to a tracking filter 120. Cx may isolate the FM path from an AM path of the tuner (not shown in FIG. 2). Note that signals of particular bands, namely FM and weather bands, may be provided directly to tracking filter 120, while instead AM signals may be separately coupled to the tuner. For example, AM can be taken directly from the antenna to AM pins on the IC (not shown in FIG. 2). In the AM path components are low impedance for AM and high impedance for FM, so each section does not affect the other section. As seen, varactor C1 and variable impedance R4 are also coupled from on-chip to tracking filter 120 to aid in tuning to the desired frequency, as well as to provide a desired level of attenuation to the incoming RF signals. Further details regarding tracking filter 120 will be discussed further below. Note further that additional attenuation may be provided by way of variable impedance R3, which is coupled from on-chip via its pin to a node N coupled between capacitor $C_x$ and tracking filter 120. Thus as seen in FIG. 2, the LNA is unused in this implementation, which may provide for improved performance as noise and sensitivity issues with regard to the LNA can be avoided. Note tracking filter 120 may be implemented using a number of components, including the antenna impedance and Cx. Thus the two attenuators connect within the tracking filter.

Because the output from the antenna and tracking filter 120 is single-ended, a balun 130 may be provided to convert the single-ended signal to a differential version for input directly to mixer 20. In the embodiment shown, balun 130 may be formed of a pair of coils. The primary coil may have a first end coupled to the output of tracking filter 120 and a second end coupled to ground. In turn, the primary coil is magnetically coupled to a secondary coil that has both ends coupled to the differential inputs to mixer 20. As seen, the secondary coil may have a center tap coupled to ground. Other components coupled to IC pins such as the voltage regulator, LNA, impedance R3, and the RF ground, may be unconnected or grounded, as shown in FIG. 2. While shown with this particular implementation in the embodiment of FIG. 2, the scope of the present invention is not limited in this regard.

Figure 3A:
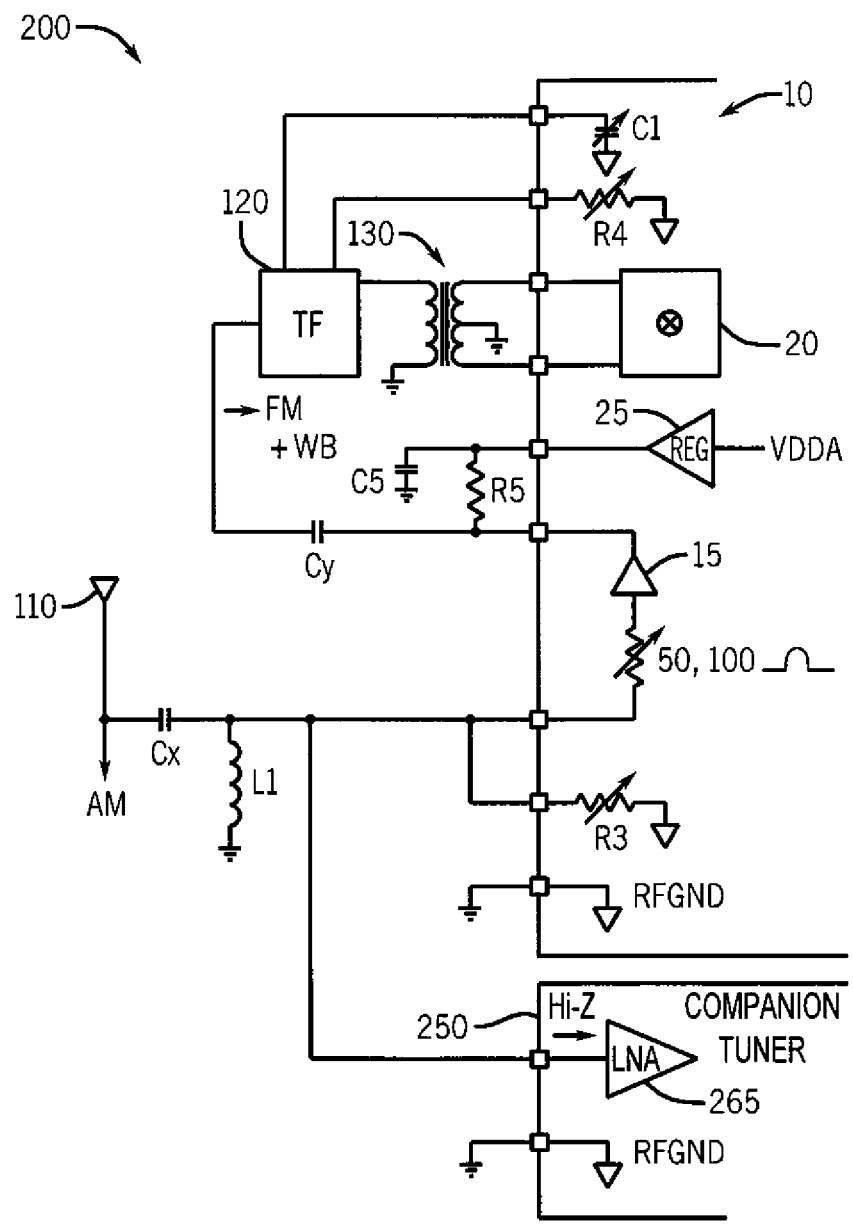
FIG. 3A is a schematic diagram of a radio system in accordance with another system.

Embodiments may also be configured to use the LNA in the loop-back mode for the situation where a companion tuner is also present. As shown in FIG. 3A, system 200 may be configured such that the incoming signal from antenna 110 is directly provided to LNA 15. As seen, in addition to coupling capacitor $C_x$, an inductance L1 may be present to provide a bias current to the LNA. Other components may also be present to adjust for the presence of Cx used to decouple the AM signal path from the FM signal path. The output from the LNA is then provided back out off-chip and through a coupling capacitor to tracking filter 120 and in turn through balun 130 back on-chip to mixer 20. Note that the coupling capacitor can be eliminated with slight changes to the tracking filter DC connections, but functionally it is similar. In one embodiment, a control signal, e.g., a control bit, e.g., of a MCU configuration register can be set to change the mixer mode from a differential configuration to a single-ended configuration. This provides flexibility for a system manufacturer to choose to use a balun or not.

LNA 15 is in the signal path in this configuration so that tracking filter 120 does not affect the antenna signal provided to a companion tuner 250. In addition, attenuator R3 may be coupled to the signal path to provide signal attenuation, e.g., as controlled by a gain controller such as an automatic gain control (AGC) circuit of the MCU. Note also in this implementation that an external load resistance R5 can couple to the LNA output and the regulator output, along with a capacitance C5 that acts as a filter capacitor for the regulator output. Note however that R5 may not be needed, as an internal load resistor connected to the same signal can be implemented, and may be adjustable to set a desired LNA gain. In other implementations, this internal resistor load can be turned off if better performance can be realized with the external load resistance. In some applications if multiple tuners are used, the input impedance (which may be at a 50 ohm termination for a single tuner implementation) can be controlled to be at 100 ohm mode, effectively causing the LNAs to become an integrated splitter that takes the RF signal and splits it into two outputs. For example, control bits may be set to control whether the LNA is to be in a 50 ohm mode, 100 ohm mode or at another impedance load.

As seen, in one embodiment companion tuner 250 may include an internal LNA 265, which in one embodiment may be a high-Z LNA. In such an embodiment, by using LNA 265 of the high-Z configuration, the input to companion tuner 250 can be directly tapped off antenna 110, reducing off-chip components. In this configuration, LNA 15 would provide the termination, and for example, would be set into 50 ohm mode. While in this configuration, the noise performance of companion tuner 250 may be affected slightly (e.g., by a few dB) although its intermodulation improves because the termination coupled to the LNA 15 of tuner 10 reduces the signals somewhat.

Figure 3B:
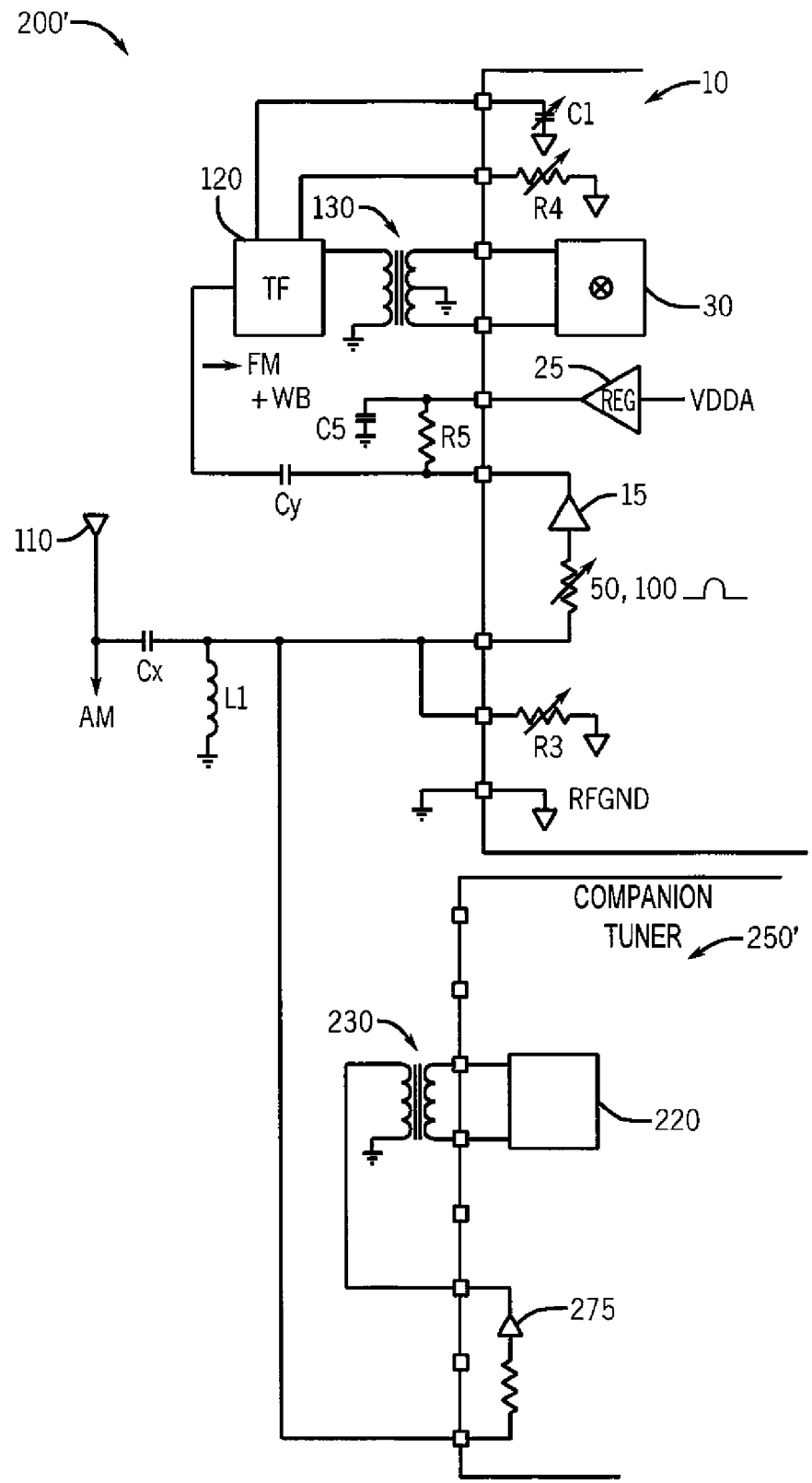
FIG. 3B is a schematic diagram of a radio system in accordance with yet another implementation.

In yet other implementations, the companion tuner may be configured in substantially the same manner as the main tuner. That is, both tuners may be of the same IC. design Referring now to FIG. 3B, shown is an implementation of a system 200' in which the companion tuner 250' is directly coupled to receive the RF signal from the antenna through its own on-chip LNA 275, which then outputs the amplified RF signal back off-chip such that it passes through a balun 230, and thereafter to a mixer 220. In the implementation of FIG. 3B the input terminations to the two LNAs may each be controlled to be at 100 ohms, providing a combined termination impedance of 50 ohms such that no matching is needed. Note however that for companion tuner 250' an additional tracking filter may not be present. However, in other implementations such a tracking filter may be present. Thus the two tuners can be coupled to the same antenna with or without tracking filters on either tuner that do not interfere with each other.

Figure 4:
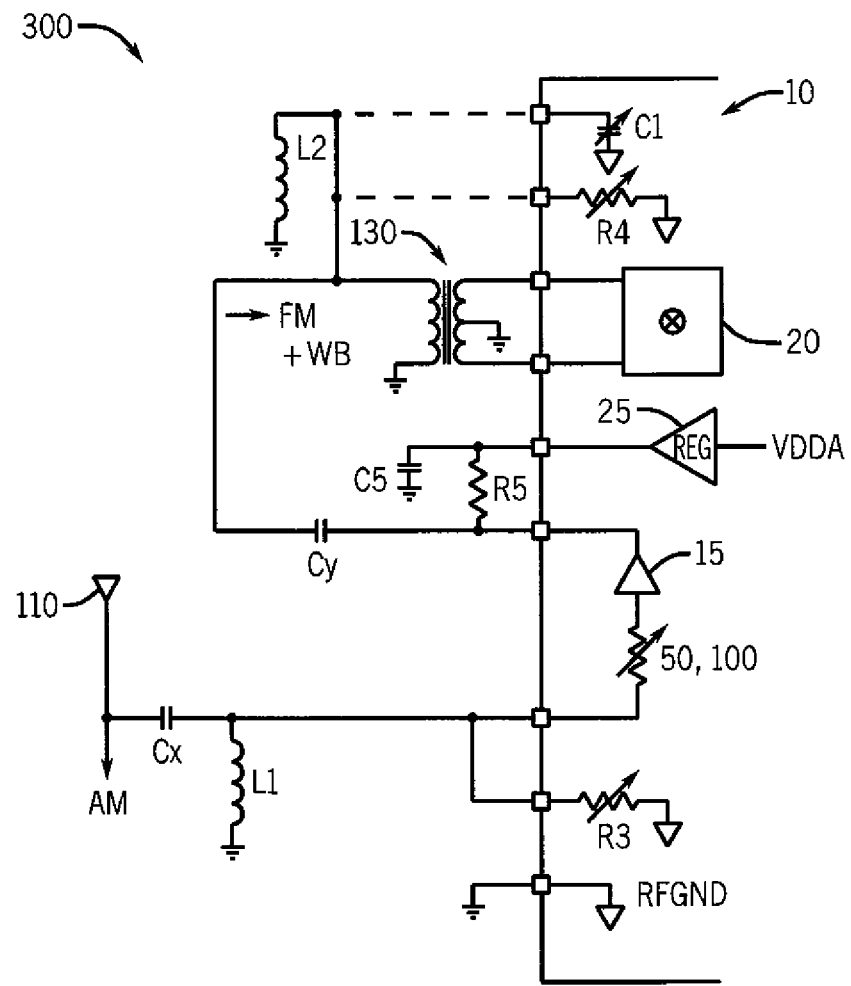
FIG. 4 is a schematic diagram of a system in accordance with a still further embodiment of the present invention.

Yet other implementations may forego use of a tracking filter. As an example, such configurations may be used in a low-BOM radio system. Referring now to FIG. 4, shown is a schematic diagram of a system in accordance with yet another embodiment of the present invention. As shown in FIG. 4, system 300 has an antenna 110 directly connected (through coupling capacitance Cx or without it) to LNA 15. As seen, the output of LNA 15 is sent off-chip and through a balun 130 to provide a differential input to mixer 20. In this implementation, no tracking filter is present. While a performance degradation may occur without the tracking filter and due to the presence of the LNA (e.g., it has some amount of noise and linearity issues), such configurations may be well-suited for many applications such as lower performance radios. In general, the other components of the front end may be as shown, with the on-chip attenuator R3 providing attenuation prior to the LNA. Note that depending on implementation and signal conditions, the varactor C1 and impedance R4, along with an off-chip inductance L2, may or may not be coupled to, e.g., an input to balun 130, to tune the center frequency of the LNA and for further attenuation.

The above discussion with regard to FIGS. 2-4 for particular usage cases is representative of some configurations of a front end of RF components of a tuner in accordance with an embodiment of the present invention. In other usage cases, still further configurations are possible.

Figure 5:
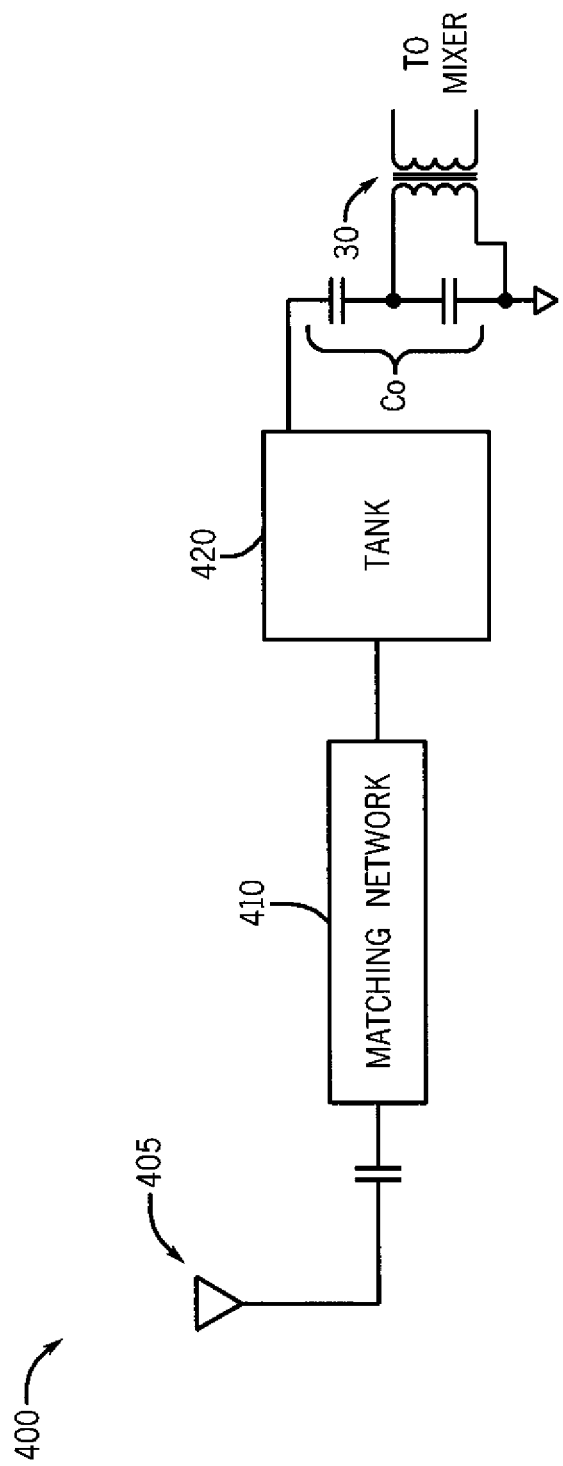
FIG. 5 is a block diagram of a tracking filter in accordance with one embodiment of the present invention.

Referring now to FIG. 5, shown is a block diagram of a tracking filter in accordance with one embodiment of the present invention. As shown in FIG. 5, tracking filter 400 may be configured as an off-chip component, although it may use one or more on-chip components in its operation. As such, the on-chip components may be closely associated with the tracking filter. The tracking filter configuration can be used for weather and FM bands. With a difference in bands of 165 MHz/88 MHz, i.e., a 1.8 ratio leads to a Cmax/Cmin of greater than 3.2, which can be achieved with the tracking filter by using on-chip varactor C1. Also in this way, design for a system manufacturer is simplified. Similarly, the on-chip varactor can be used to tune a radio to cover other bands, such as 76-90 MHz for Japan, or 76-108 MHz to make a radio suitable for most of the world.

As seen in FIG. 5, tracking filter 400 may be coupled to receive an incoming RF signal, e.g., a single-ended signal from an antenna 405. In the embodiment of FIG. 5, the signal path from the antenna to tracking filter 400 includes a coupling capacitor which may be sized such that at low frequencies of AM signals, the capacitor acts as a high impedance block so that the AM section does not see the low impedance components in the FM section that would reduce the size of the received AM signal.

As shown in FIG. 5, tracking filter 400 may generally include a matching network and a tank. Matching network 410 may provide nodes for attenuation which can be provided, e.g., using off-chip attenuators as well as providing a connection from an on-chip attenuator, e.g., R4. In turn, tank 420 may provide frequency selectivity with a relatively high Q factor, e.g., approximately 25 in one embodiment. To provide further attenuation, a capacitive network $C_O$ may be provided at the tank output, with an intermediate node that can couple to balun 30. While shown with this high level in the block diagram of FIG. 5, understand that various implementations are possible.

Figure 6:
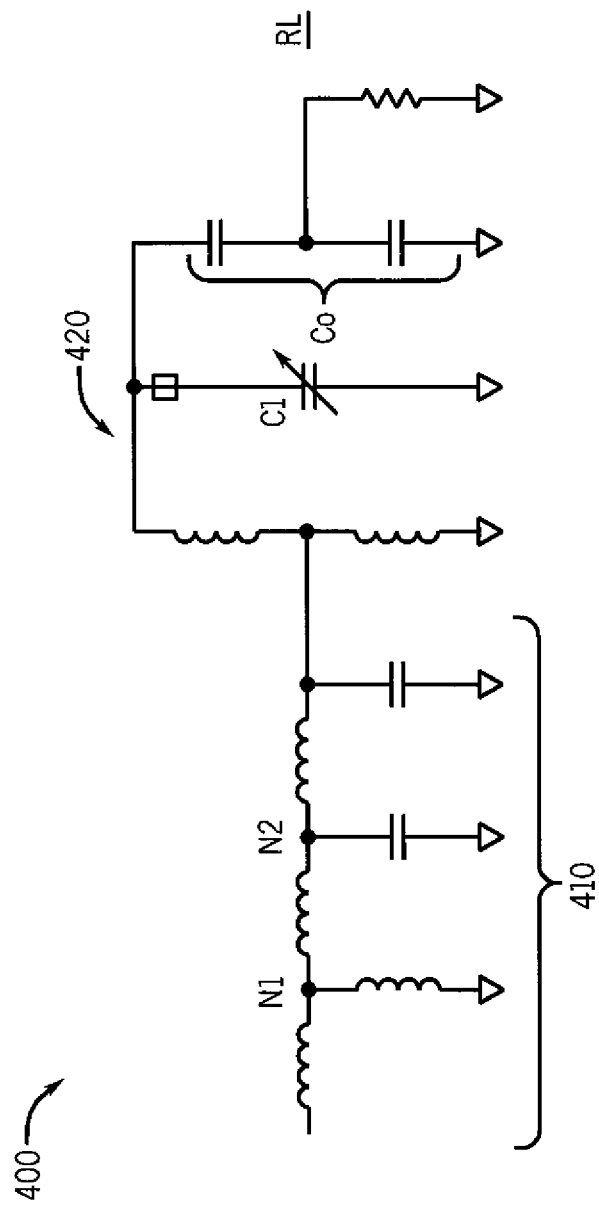
FIG. 6 is a schematic diagram of a tracking filter in accordance with an embodiment of the present invention.

Referring now to FIG. 6, shown is a schematic diagram for the details of a tracking filter in accordance with an embodiment of the present invention. As shown in FIG. 6, tracking filter 400 includes a matching network 410 that may include a plurality of series-coupled inductors along with several capacitances and an inductance in parallel. This matching network may provide low Q matching and further provide nodes for attenuation. As seen, nodes $N_1$ and $N_2$ may provide attenuation nodes to which, e.g., on or off-chip attenuators can be coupled. As one example, impedances from approximately 50 ohms to 400 ohms may provide for attenuation. Of course, other topologies can be used such as implemented using series capacitors with inductances coupled to ground or a combination of inductors and capacitors in a series path.

In turn, matching network 410 may couple to a tank 420 that includes a LC combination. The inductors may include a pair of series inductors that are in turn coupled in parallel to a controllable capacitance, which may be implemented using on-chip varactor C1, which may have a relatively high Q factor, e.g., of approximately 100 in one embodiment. By controlling the varactor, tuning can be accomplished. As seen, the output of the LC tank 410 may be coupled to a capacitive divider $C_O$ and a mixer load $R_L$ to set the proper level for the mixer and present the tank with a higher impedance. In one embodiment, $R_L$ may be a two kiloohm load. To have a high Q, a tracking filter may have a high impedance at the resonance frequency. The network transforms the incoming RF signal which may be from a 50 ohm source to be a high impedance signal. In some implementations, the impedance at the tracking filter input may be on the order of several kiloohms.

A tuner in accordance with an embodiment of the present invention may be provided with circuitry and controls to perform various calibration operations. To aid in performing frequency calibration, e.g., by way of calibrating the on-chip varactor, a test tone generator (e.g., generator 40 of FIG. 1) may provide a signal at a known frequency, e.g., at a LO frequency. The test tone generator may include a buffer that makes a strong signal, which can then be driven through an impedance (resistive or other) to nodes of the tracking filter. The attenuator resistors that also act on the tracking filter can then be used to control the level of the test tone applied to the network. In one example, the buffer and a fixed resistor are on chip, and are connected to the same pins as the attenuators. In some embodiments, the fixed resistor can have multiple settings to give additional range. This arrangement can be thought of as a voltage divider between the fixed resistance from the buffer, and the variable attenuator resistor that has the lower end connected to ground. And as the attenuators are connected to nodes in tracking filter 400, this variable test tone signal is presented into the network. For example, if one attenuator is connected near the antenna at Cx, then the test tone signal is effectively like a signal at the antenna. In this way, a signal can be directed effectively to the antenna input. The signal then goes through the tracking filter into the mixer, which due to the high Q also filters harmonics that may have been present in the original test tone source, giving a relatively clean RF test signal. As the tuner may have peak detectors that analyze the signal at the mixer inputs and/or outputs (as well as LNA inputs and/or outputs), the signal strength can be set to optimize the range of this test tone so that the signal falls within the range of the peak detectors. In one embodiment, a 100 MHz test tone may be applied, and the varactor can be adjusted until a maximum signal is seen on the peak detectors to thus tune the tracking filter. In one embodiment, two test tone outputs can be selectively switched on or off to be applied to the attenuators R3 and R4. Further, by changing the resistance of the attenuator(s), the test tone signal strength can be controlled.

In one embodiment, a one-time calibration may be performed on the tracking filter. The test tone generator may be used to perform this calibration. Note that the calibration may be performed at a plurality of frequencies, e.g., every 0.2 MHz of a tuning range to obtain sufficient data points. Then a table may be generated and stored, e.g., in a non-volatile memory of the radio that can then be downloaded to the tuner during operation. In an implementation having non-volatile memory within the tuner, this table may be stored in the tuner itself. In this way, the table can be accessed by the controller when tuning to a channel. In other embodiments, instead of a one-time factory programming, embodiments may perform calibration in normal use, e.g., every time a user turns on the radio or each time a new channel is tuned, a subset of the calibration at the tuned frequency can be performed.

Figure 7A:
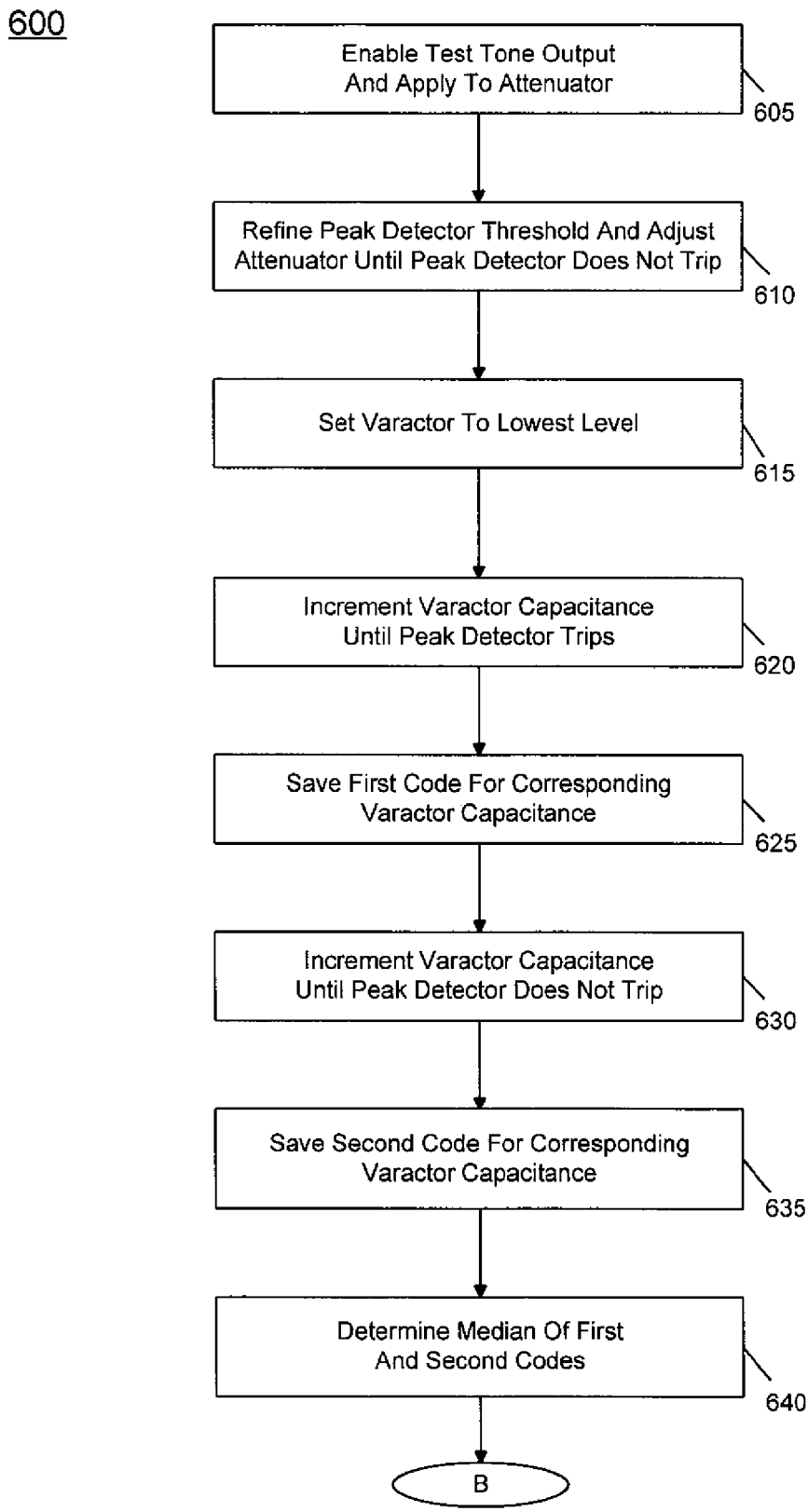
FIGS. 7A and 7B are flow diagrams of a method for calibrating a varactor in accordance with an embodiment of the present invention.
Figure 7B:
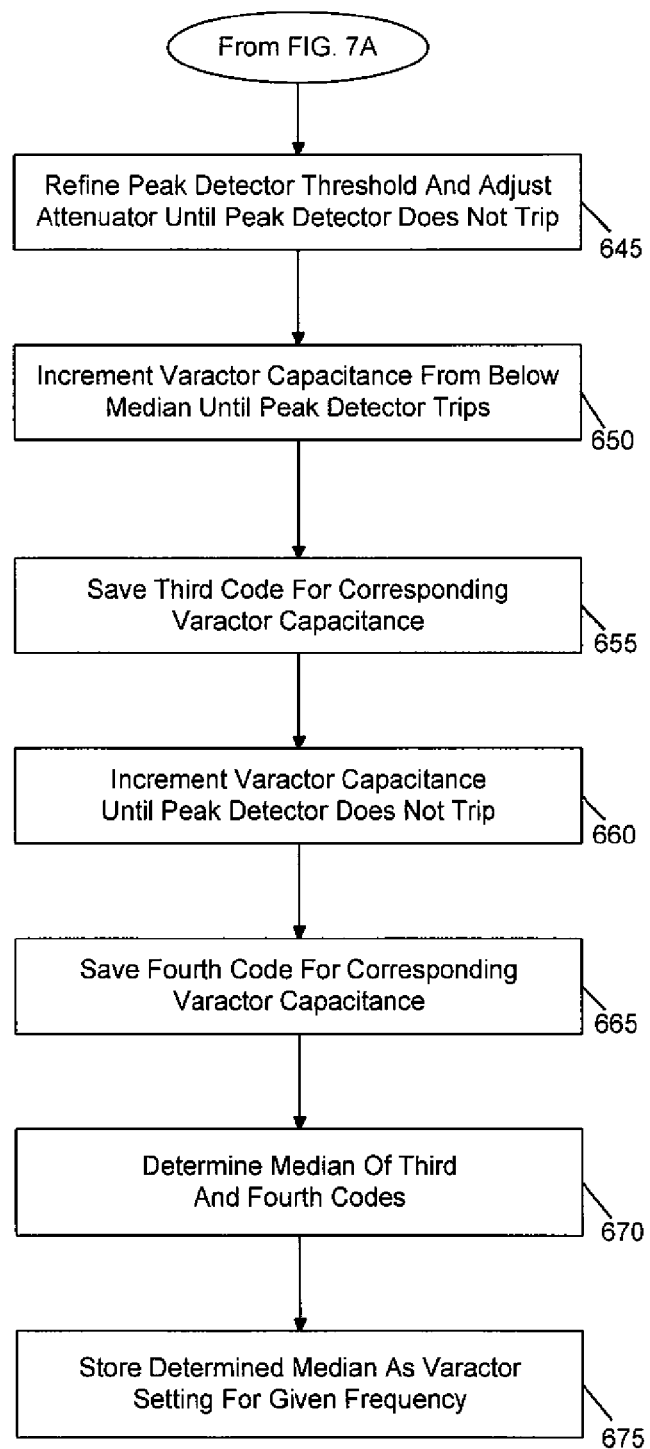

Referring now to FIGS. 7A and 7B, shown are flow diagrams of a method for calibrating a varactor in accordance with an embodiment of the present invention. More specifically, method 600 may be used to perform calibration operations which can be used to obtain control parameters for controlling the varactor dependent upon a desired frequency of operation. As discussed above, method 600 can be performed once, e.g., at a factory calibration or during manufacture of a radio including the IC. In still other implementations, this calibration may be run, e.g., on every power up of the radio. In general, the calibration proceeds using a test tone and attenuator(s) and one or more RF peak detectors for calibration of the varactor. The calibration can be performed at a single, two or multiple frequencies. As one example, two frequencies, e.g., 76 MHz and 108 MHz can be used. Then a function for a resonant circuit can be used to generate constants that are then stored. Then the MCU can use these constants to set the appropriate varactor value for any frequency.

As seen in FIG. 7A, method 600 may begin by entering a test tone mode (block 605). For example, a tuner MCU may control a test tone generator to be enabled and to output a test tone signal. Still further, additional components of the radio may be controlled. For example as shown in FIG. 7A, the test tone generator output, i.e., a test signal may be applied or switched to a controllable attenuator. For example, with reference back to FIG. 1, a test signal output from test tone generator 40 may be coupled to controllable attenuator R4.

The calibration may begin with the attenuator in a high impedance (off) state and the varactor at its lowest capacitance value. Then the peak detector threshold is refined (block 610). Starting with the lowest peak detector threshold, the threshold is then raised until the peak detector is not tripped. If required, additional attenuation can be inserted. Once a combination of peak detector threshold and attenuation level is found where the peak detector is not tripped, method 600 continues at block 615, where the varactor is set to its lowest level (e.g., a digital code of 0, meaning the capacitance is set is at its minimum). Then the varactor capacitance is adjusted, e.g., incremented until the peak detector trips, e.g., to a 1 code (block 620). The code controlling the varactor at this trip point is saved as a first code (block 625). Then continued sweeping of the varactor occurs until enough capacitance has been added so the front end is not properly tuned and the peak detector trips back to 0 (block 630). The control for obtaining this capacitance value may be stored as a second code (block 635). Using the first and second codes, a median value may be determined (block 640).

Referring now to FIG. 7B, the method may continue, generally in the same fashion to obtain a final varactor setting for the frequency under calibration. Specifically, the threshold is refined, but now using the new varactor value that is close to the correct value (block 645). Then another sweep of capacitance values starting below the median value to above the median value is done to find the two points where the peak detector tripped (on and then off) (blocks 650 to 670). The median value of these two points may be determined to find the correct varactor value for this frequency (block 670), which may then be stored, e.g., in a non-volatile storage (block 675). This non-volatile storage may be of the radio system itself. Then during normal operation the varactor setting, which corresponds to a given frequency may be downloaded from the radio to a memory of the MCU.

Note that this calibration method may be performed iteratively for multiple frequencies, e.g., a number of frequencies for a given band of operation. Then interpolations may be performed based on the determined varactor settings such that for each possible channel, a corresponding varactor setting is provided. In various embodiments, using a subset of frequencies of a band of interest a linear interpolation may be performed or a second-order equation may be executed to generate values for the other frequencies of the band of interest. Or a given equation describing the function can be used to determine varactor values using the constants determined from the calibration. While shown with this particular implementation in the embodiment of FIG. 7, the scope of the present invention is not limited in this regard.

Figure 8:
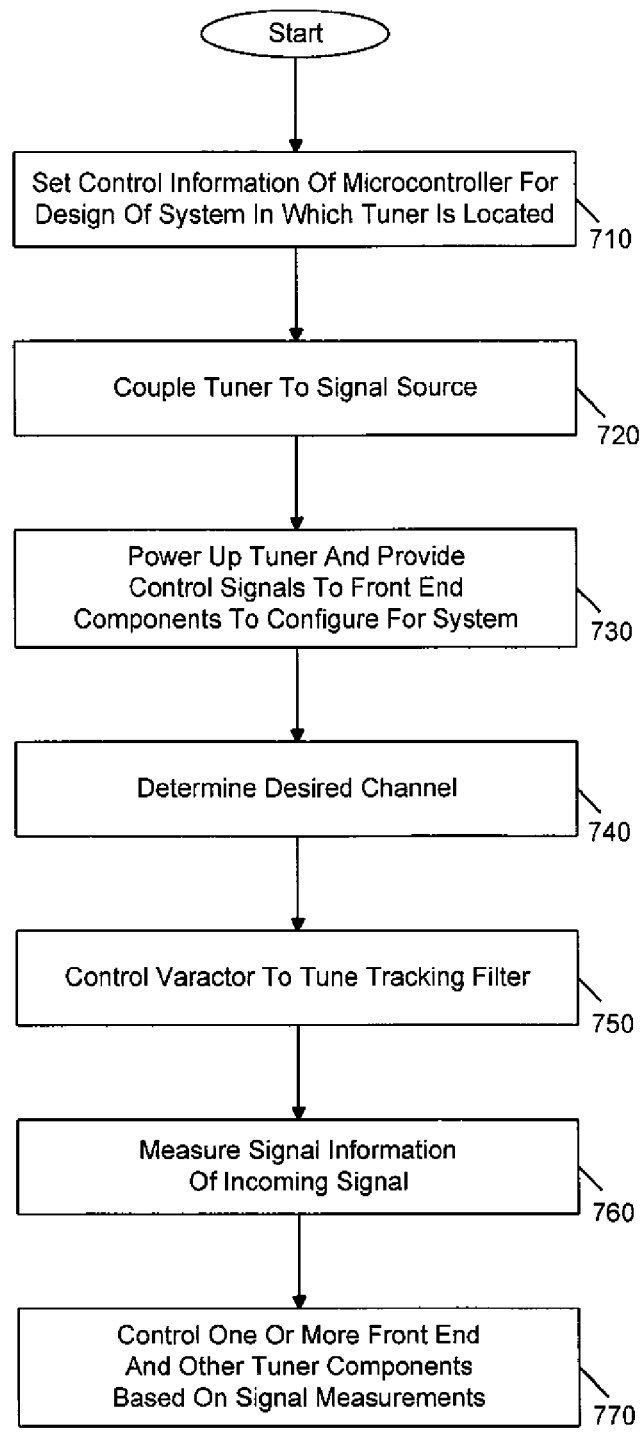
FIG. 8 is a flow diagram of a method for controlling a radio tuner in accordance with an embodiment of the present invention.

Referring now to FIG. 8, shown is a flow diagram of a method for controlling a radio tuner in accordance with an embodiment of the present invention. As shown in FIG. 8, method 700 may be implemented to provide initial control parameters for a radio configured into a particular system environment, as well as for operating the radio in normal use in that environment. As seen, method 700 may begin by setting control information of a microcontroller of the radio (block 710). More specifically, control information may be set for a given system in which the radio tuner is located. For example, the tuner may be in many different radio types such as low BOM systems, systems including tracking filters, baluns, matching networks, a companion tuner and so forth. Based on a given implementation, basic control settings of the receiver may be set in non-volatile storage of the microcontroller. For example, configuration information for either enabling or disabling of the LNA, for configuring a mixer for single-ended or differential operation and so forth may be set. These parameters may be stored, e.g., in a non-volatile memory and the configuration information may be provided to a configuration register of the microcontroller of the tuner IC during normal operation. Alternatively, non-volatile memory may be implemented in the tuner IC to hold the configuration information. Once configured, the IC including the tuner may be coupled to a signal source (block 720). For example, during manufacture the IC may be incorporated onto a circuit board of the radio and coupled to an antenna cable that in turn has an appropriate connection to an antenna. Accordingly, manufacture is complete and the radio may be incorporated into an end user product, e.g., as a car radio or in another system.

Accordingly, in the field a user may power up the tuner (block 730). During this power up, various control signals from the MCU may be provided to the front end components for configuring the system. As discussed, these signals may be control signals to selectively enable/disable various front end components and to set impedance values for other such components. Then based upon a user input the system may determine a desired channel (block 740). To aid in tuning to the desired channel based upon its frequency, the varactor may be controlled accordingly (block 750). For example, control values may be provided, e.g., as a table, from a non-volatile storage of the radio to the MCU during the power up process, to appropriately control the varactor to provide a desired capacitance to a tracking filter, when present. Note if no tracking filter is present, the varactor may be used to tune a lower Q broadband filter. In this case, however, tuning is less critical, and a few optimal values may be stored in non-volatile memory, or the varactor may not be used.

At this point, the desired RF signal is received and audio information from the desired channel may be processed and output. During operation, various gain control stages may be controlled to be at an appropriate level based on signal information. Accordingly, at block 760, signal information of the incoming signal may be measured. For example, peak detectors may be located at various portions of the tuner IC, e.g., at the mixer input and/or output or other locations. Based on this information, the MCU may provide control signals to one or more front end and other tuner components to appropriately provide settings for the attenuators, LNA and other gain stages (block 770). While shown with this particular implementation in the embodiment of FIG. 8, the scope of the present invention is not limited in this regard.

Figure 9:
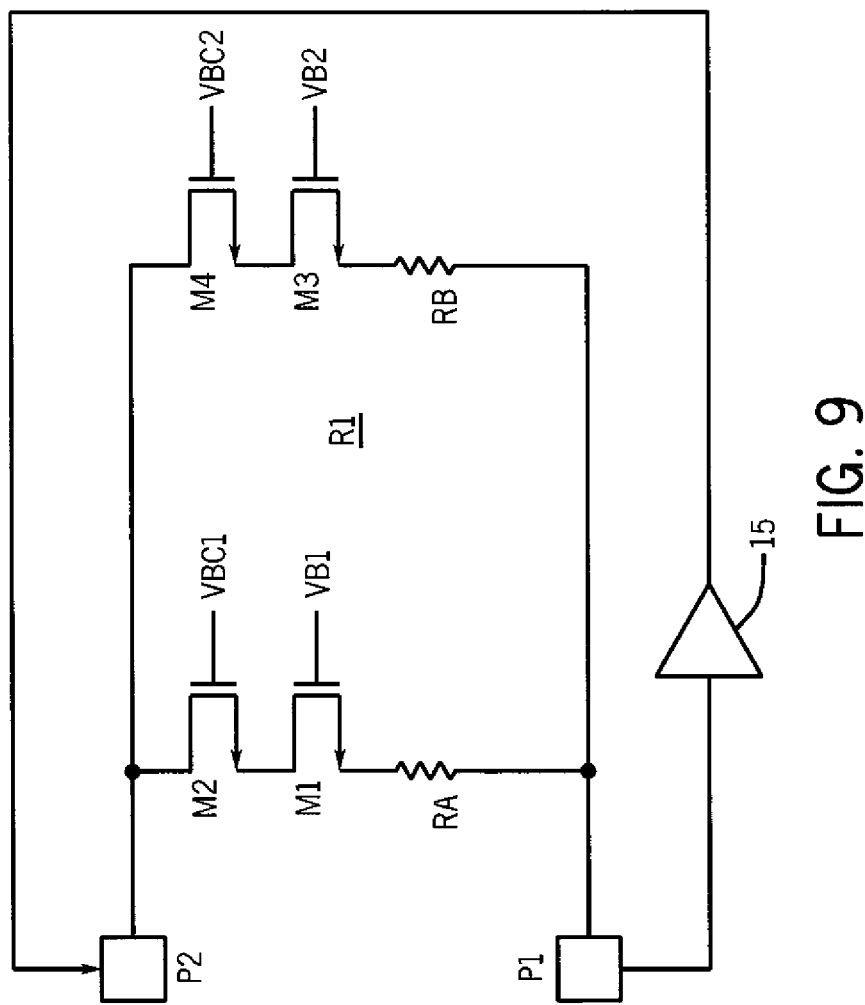
FIG. 9 is a schematic diagram of a controllable input impedance in accordance with an embodiment of the present invention.

As described above in different settings a controllable input stage of the LNA can be controlled by the MCU, e.g., for matching purposes in different system implementations with ease of flexibility. Referring now to FIG. 9, shown is a schematic diagram of a controllable input stage in accordance with an embodiment of the present invention. As shown in FIG. 9, an LNA 15 may be coupled between two pins of the IC. Namely LNA 15 is coupled to receive an incoming RF signal via an input pin P1, and output an amplified version of the input signal via an output pin P2. While the input impedance can take various forms, in some implementations the impedance may be a combination of fixed impedances and variable impedances realized by way of MOSFETs or other switch devices.

Thus in the embodiment of FIG. 9, an input impedance R1 may take the form of parallel branches having fixed resistances and MOSFETs coupled in series. The left branch may include a fixed resistor $R_A$ and a common gate topology including a cascode transistor and an amplifier transistor. As seen, $R_A$ may couple between the input pin and a first MOSFET which may be an NMOS M1 having a source terminal coupled to the fixed resistance, a gate terminal coupled to receive a bias voltage $V_{B1}$, and a drain terminal coupled to a cascode device, i.e., a second NMOS M2 having its source terminal coupled to the drain terminal of M1, a gate terminal coupled to receive a second bias voltage $V_{BC2}$, and a drain terminal coupled to the output pin P2. As seen, the second branch may be formed of similar components, including a fixed resistance $R_B$ and transistors M3 and M4. Based on control of the various bias voltages, the effective input impedance can be controlled to be at a desired level. In some embodiments, the fixed resistances may form a greater part of the impedance than the impedance realized by the MOSFETs (e.g., approximately 4:1 ratio in one embodiment). In one embodiment, each branch may have an impedance of 100 n. In one embodiment, $V_{BC1}$ and $V_{BC2}$ may be controlled to be the same voltage when both branches are coupled into the signal path, or these bias voltages may be independently controlled, e.g., so one branch may be switched off. While not shown in FIG. 9, understand that the second branch can be controllably switched in or out of the signal path, depending on the desired impedance. Furthermore, while shown with only two such branches in the embodiment of FIG. 9, additional branches may be present in other embodiments.

FIGS. 1-4 described above show only limited RF front end components of a radio tuner. As described, a radio tuner in accordance with one embodiment of the present invention may be a CMOS mixed signal chip including both analog and digital circuitry. However, it is to be understood that embodiments may be implemented in many different receivers such as a radio transceiver capable of multi-band operation, e.g., AM, FM and weather bands.

Figure 10:
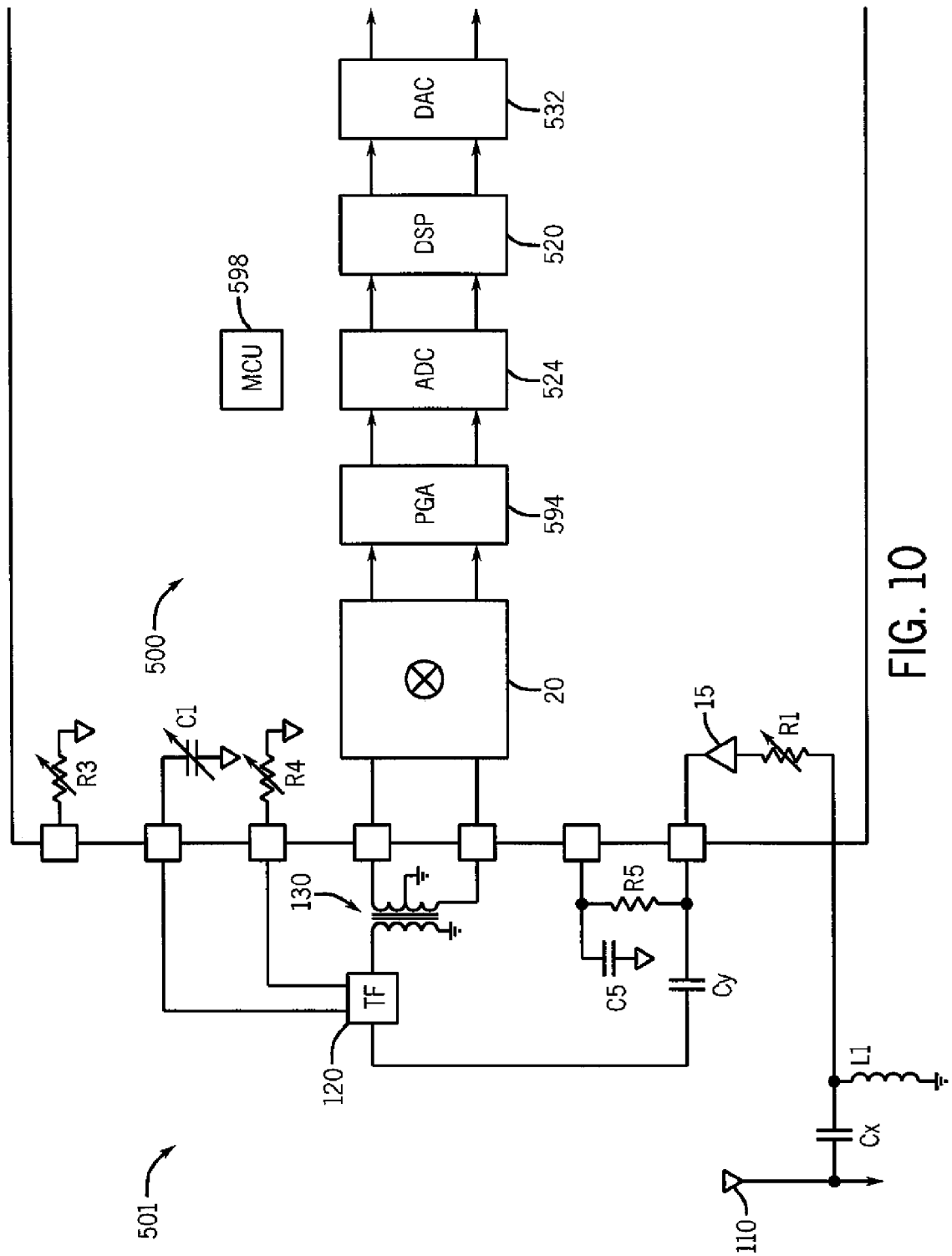
FIG. 10 is a block diagram of a radio system in accordance with an embodiment of the present invention.

Referring now to FIG. 10, shown is a block diagram of a radio system in accordance with an embodiment of the present invention. As shown in FIG. 10, radio system 501 includes a receiver 500 than can be fabricated on a monolithic semiconductor die. The receiver 500 may perform multi-band reception and processing using several different signal processing modes of operations.

An incoming RF signal is received from an external receive antenna 110 and via a signal path including a capacitance $C_x$ an inductance L1, an on-chip controllable impedance R1 to LNA 15 (which in this system is part of the signal path, although in other configurations it may be controlled not to be). In the configuration of FIG. 10, the output of LNA 15 may be output from receiver 500 via an output pin to off-chip components including a tracking filter 120 and a balun 130. Then, the signal is input back on chip to a mixer 20, which may be a complex mixer, controlled by a tunable local oscillator, the frequency of which selects the desired radio channel to which the receiver 500 is tuned. In other implementations, mixer 20 can be coupled to receive an input directly from an antenna (without a tracking filter or LNA in the signal path), or via an on-chip connection (e.g., through a multiplexer) with a second LNA (not shown in FIG. 10). In this way, configurations can be selected to provide for input through various components. For attenuation and tuning control, also note that variable impedances R1 and R4 (and potentially R3) and a varactor C1 may also be connected to pins of receiver 500 such as discussed above. In general, the receiver components through mixer 20 may be considered to be the RF front end components.

In response to the incoming RF signal, mixer 20 produces corresponding analog intermediate frequency (IF), quadrature signals that pass through a programmable gain amplifier (PGA) 594 before being routed to an ADC 524 which converts the analog IF signals from the PGA 594 into digital signals, which are provided to a DSP 520. In general, the components from PGA 594 through ADC 524 may be considered to be an IF section, and which may be configured to operate at a low-IF.

DSP 520 demodulates the received complex signals to provide corresponding digital left and right channel stereo signals at its output terminals; and these digital stereo signals are converted into analog counterparts by a DAC 532, which can provide audio output from the chip, or in some implementations digital outputs can be taken directly from the DSP.

In accordance with some embodiments of the invention, the multimode FM receiver 500 may also include a microcontroller unit (MCU) 598 that coordinates the general operations of the receiver 500, such as configuring the receiver for a given system implementation. To this end, MCU 598 may include a control storage such as a non-volatile memory (or it may be coupled to an on-chip non-volatile memory) that may include various configuration settings for controlling the various front end and other components for a particular type of system in which the receiver is implemented. For example, MCU 598 may read a configuration register and output control signals to cause control of the configurable front end components, including whether LNA 15 is to be connected or disconnected to the signal path, whether mixer 20 is to operate in a single-ended or differential mode, and control of impedance and capacitance levels for controllable impedances R1, R3, R4 and varactor C1. In addition, other settings such as input termination impedance level, as well as providing control signals to control gain and attenuation settings of the various front end components can be performed. As such, embodiments may include an article in the form of a computer-readable medium onto which instructions are written. These instructions may enable the DSP and MCU, or other programmable processor to perform front end configuration and control to perform signal processing, as well as other processing in accordance with an embodiment of the present invention.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A system comprising:
an antenna to receive a radio frequency (RF) signal; and
a radio tuner located at least in part in an integrated circuit (IC), the radio tuner including a configurable front end having a low noise amplifier (LNA) having an input coupled to a first pin of the IC and an output coupled to a second pin of the IC to output an amplified RF signal from the IC, and a mixer having an input coupled to a third pin and a fourth pin of the IC, wherein the mixer is configured to receive an incoming RF signal via the third pin when the incoming RF signal is single-ended and via the third and fourth pins when the incoming RF signal is differential.

2. The system of claim 1, further comprising a variable impedance coupled to a fifth pin of the IC, and a varactor coupled to a sixth pin of the IC.

3. The system of claim 2, further comprising a tracking filter coupled to the second pin of the IC to receive the amplified RF signal from the LNA and to output a filtered RF signal for input to the mixer, wherein the tracking filter includes a tank formed of an inductance and the varactor, wherein the varactor is coupled to the tracking filter via the sixth pin.

4. The system of claim 3, wherein the IC further includes a controller to control the LNA to receive and amplify the RF signal.

5. The system of claim 4, wherein the controller is further to cause selective coupling of a predetermined capacitance to the tracking filter via control of the varactor.

6. The system of claim 4, wherein the controller is to cause selective coupling of a selected impedance of the variable impedance via the fifth pin to a node of a matching network coupled to an input of the tracking filter based on a level of the RF signal.

7. The system of claim 1, further comprising a controllable impedance coupled to the first pin of the IC, the controllable impedance including a first fixed resistance coupled to the first pin, a first transistor coupled to the first fixed resistance and a second transistor coupled between the first transistor and the second pin, wherein the first and second transistors have gate terminals coupled to receive control voltages to control an impedance of the controllable impedance.

8. The system of claim 7, wherein the controllable impedance further includes a second fixed resistance coupled to the first pin, a third transistor coupled to the second fixed resistance and a fourth transistor coupled between the third transistor and the second pin, wherein the third and fourth transistors have gate terminals coupled to receive control voltages to control an impedance of the controllable impedance.

9. A method comprising:
receiving a radio frequency (RF) signal from an antenna in a radio tuner located at least in part in an integrated circuit (IC), including:
receiving the RF signal via a first pin of the IC coupled to a low noise amplifier (LNA) and outputting the amplified RF signal to a second pin of the IC; and
receiving an incoming RF signal via a third pin of the IC coupled to a mixer, wherein the mixer is configured to receive the incoming RF signal via the third pin when the incoming RF signal is single-ended and via the third pin and a fourth pin coupled to the mixer when the incoming RF signal is differential.

10. The method of claim 9, further comprising coupling a variable impedance to a fifth pin of the IC, and coupling a varactor to a sixth pin of the IC.

11. The method of claim 10, further comprising coupling a tracking filter to the second pin of the IC to receive the amplified RF signal from the LNA and to output a filtered RF signal for input to the mixer, wherein the tracking filter includes a tank formed of an inductance and the varactor, wherein the varactor is coupled to the tracking filter via the sixth pin.

12. The method of claim 11, further comprising controlling the LNA to receive and amplify the RF signal via a controller of the IC.

13. The method of claim 12, further comprising causing selective coupling of a predetermined capacitance to the tracking filter via control of the varactor.

14. The method of claim 13, further comprising causing selective coupling of a selected impedance of the variable impedance via the fifth pin to a node of a matching network coupled to an input of the tracking filter based on a level of the RF signal.

15. An apparatus comprising:
a radio tuner located at least in part in an integrated circuit (IC), the radio tuner including a configurable front end having a low noise amplifier (LNA) having an input coupled to a first pin of the IC to receive a radio frequency (RF) signal from an antenna and an output coupled to a second pin of the IC to output an amplified RF signal from the IC, and a mixer having an input coupled to a third pin and a fourth pin of the IC, wherein the mixer is configured to receive an incoming RF signal via the third pin when the incoming RF signal is single-ended and via the third and fourth pins when the incoming RF signal is differential.

16. The apparatus of claim 15, further comprising a variable impedance coupled to a fifth pin of the IC, and a varactor coupled to a sixth pin of the IC.

17. The apparatus of claim 16, further comprising a tracking filter coupled to the second pin of the IC to receive the amplified RF signal from the LNA and to output a filtered RF signal for input to the mixer, wherein the tracking filter includes a tank formed of an inductance and the varactor, wherein the varactor is coupled to the tracking filter via the sixth pin.

18. The apparatus of claim 17, wherein the IC further includes a controller to control the LNA to receive and amplify the RF signal.

19. The apparatus of claim 18, wherein the controller is further to cause selective coupling of a predetermined capacitance to the tracking filter via control of the varactor.

20. The apparatus of claim 18, wherein the controller is to cause selective coupling of a selected impedance of the variable impedance via the fifth pin to a node of a matching network coupled to an input of the tracking filter based on a level of the RF signal.

* * * * *